United States Patent
Veendrick et al.

(10) Patent No.: US 8,139,401 B2
(45) Date of Patent: Mar. 20, 2012

(54) INTEGRATED CIRCUIT WITH A MEMORY MATRIX WITH A DELAY MONITORING COLUMN

(75) Inventors: Hendricus J. M. Veendrick, Heeze (NL); Harold G. P. Benten, Waalre (NL); Agnese A. M. Bargagli-Stoffi, Eindhoven (NL); Patrick Van de Steeg, Oss (NL)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 12/866,876

(22) PCT Filed: Feb. 9, 2009

(86) PCT No.: PCT/IB2009/050518
§ 371 (c)(1),
(2), (4) Date: Aug. 9, 2010

(87) PCT Pub. No.: WO2009/101568
PCT Pub. Date: Aug. 20, 2009

(65) Prior Publication Data
US 2010/0315860 A1    Dec. 16, 2010

(30) Foreign Application Priority Data
Feb. 11, 2008   (EP) ..................... 08101458

(51) Int. Cl.
*G11C 11/00* (2006.01)
*G11C 5/06* (2006.01)
*G11C 7/00* (2006.01)

(52) U.S. Cl. .............. 365/154; 365/63; 365/194
(58) Field of Classification Search .......... 365/154, 365/155, 156, 63
See application file for complete search history.

(56) References Cited

U.S. PATENT DOCUMENTS

| | | | |
|---|---|---|---|
| 6,178,134 B1 | 1/2001 | Evans et al. | |
| 2003/0001185 A1 | 1/2003 | Sell et al. | |
| 2004/0100336 A1 | 5/2004 | Christensen et al. | |
| 2006/0050600 A1 | 3/2006 | Venkatraman | |
| 2006/0097802 A1 | 5/2006 | Chan et al. | |
| 2007/0025162 A1* | 2/2007 | Deng et al. | 365/189.09 |
| 2007/0086232 A1 | 4/2007 | Joshi et al. | |
| 2008/0112245 A1* | 5/2008 | Ostermayr et al. | 365/210.1 |

OTHER PUBLICATIONS

International Search Report and Written Opinion for Application PCT/IB2009/050518 (Feb. 9, 2009).

* cited by examiner

*Primary Examiner* — Ly D Pham

(57) ABSTRACT

An integrated circuit has a matrix of rows and columns of cells (10, 18, 19), each cell (10, 18, 19) comprising a first inverter (100) and a second inverter (102). First columns have a bit-line (12a,b), the first inverter (100) and the second inverter (102) in each cell of the first columns being cross-coupled to each other and coupled to bit-line (12a,b) of the associated first column. A further column is provided in the matrix with bit line fragments (16) that are mutually disconnected. Delays are monitored by coupling at least the first inverters (100) of cells in respective pairs of rows in series via the bit-line fragments and measuring a delay during signal propagation through the series connection, for example by incorporating the series of inverters in a ring oscillator.

10 Claims, 5 Drawing Sheets

INTEGRATED CIRCUIT WITH A MEMORY MATRIX WITH A DELAY MONITORING COLUMN

FIELD OF THE INVENTION

The invention relates to an integrated circuit comprising a matrix of memory cells.

BACKGROUND

From US patent application No. 2007086232 it is known to connect circuits from a row of a static memory matrix in a ring oscillator configuration. By measuring the oscillation frequency of such a ring oscillator timing properties of the memory cells can be tested. In fact, the ring-oscillator represents a delay circuit, with a delay that is representative of the properties of the memory cells. The delay is measured from the oscillation frequency.

Conventionally, columns in a memory matrix are associated with bit lines (conductors) extending along the columns, for accessing data from selected cells in the column, and rows in the memory matrix are associated with word lines (conductors) to control connection of cells to bit-lines on a row by row basis. The memory cells have cross-coupled inverters and access transistors coupling the cross-coupled inverters to bit-lines.

US patent application 2007086232 shows various embodiments of the ring oscillator. In each of these embodiments circuits from different cells in a row of the matrix are interconnected. In one embodiment, additional conductors are provided to couple the inputs of the inverters of each cell in the row to the bit-lines of the cell in a previous column. The input of each inverter is also coupled to the gate of the access transistor that couples the output of the inverter to the bit line. Thus, a ring-oscillator is formed, wherein the cross-coupled inverters of a row are coupled in series in a circuit loop. In another embodiment the cross-coupling between the inverters is broken-up. In this embodiment the inverters in each cell of a row are coupled in series and additional conductors are provided between the inputs and outputs of series arrangements of inverters of the different cells in the row, bypassing the bit-lines. In this embodiment the access transistors are used as loads of the inverters, with channels coupled between the outputs of the inverters and the bit-lines. The gates of the access transistors are grounded. Thus, a ring-oscillator is formed, wherein the series arrangements inverters of the rows are coupled in series in a circuit loop.

For circuit design purposes it is desirable that the layout of the cells that make up part the ring-oscillator fit within shape and size of the regular static memory cells of the matrix. In the embodiments of US patent application 2007086232 it is difficult to fit the ring-oscillator into a row of the same row height as rows of normal memory cells. In the first embodiment, a complete static memory cells used except for word lines, and conductors between bit lines and inverters are added, as well as conductors between inverter inputs and gates of access transistors, plus contacts between these conductors and various components. Also in the second embodiment extra room is needed for additional conductors between the channels of the transistors in the inverters in adjacent cells.

In addition the embodiment with the cross-coupled inverters can be disadvantageous because the cross-coupled inventors counteract each other's transitions, which makes the oscillation frequency of the ring oscillator strongly dependent on the ratio of the output transistors of the inverters. As a result oscillation frequency may have limited usefulness for testing the memory cells.

SUMMARY

The invention aims to provide for an integrated circuit with a memory matrix, wherein timing of cells can be tested without deviating from the normal pitch of the matrix.

An integrated circuit according to claim 1 is provided. Herein, instead of a normal bit line, a fragmented bit-line is used in a column of a matrix that comprises memory cells. The fragmented bit line comprises mutually disconnected bit-line fragments. The bit-line fragments are used to couple inverters of different cells in the column in series. By using bit-line fragments, it can be avoided that an excessively large cell is needed to realize the series connection. In an embodiment these series coupled inverters of different cells and bit line fragments may be part of a circuit loop of a ring oscillator.

In different embodiments various combinations of bit line fragments may be used. In an embodiment a column has a first and second fragmented bit line in parallel, both used to realize a series arrangement of inverters from different cells in the column. In another embodiment a column has a fragmented bit line in combination with an unfragmented bit line, both used to realize a series arrangement of inverters from different cells in the column.

BRIEF DESCRIPTION OF THE FIGURES

These and other objects and advantages will become apparent from the following description of example embodiments of the invention, using the following Figures, in which.

DETAILED DESCRIPTION OF EXAMPLE EMBODIMENTS

Figure 1:
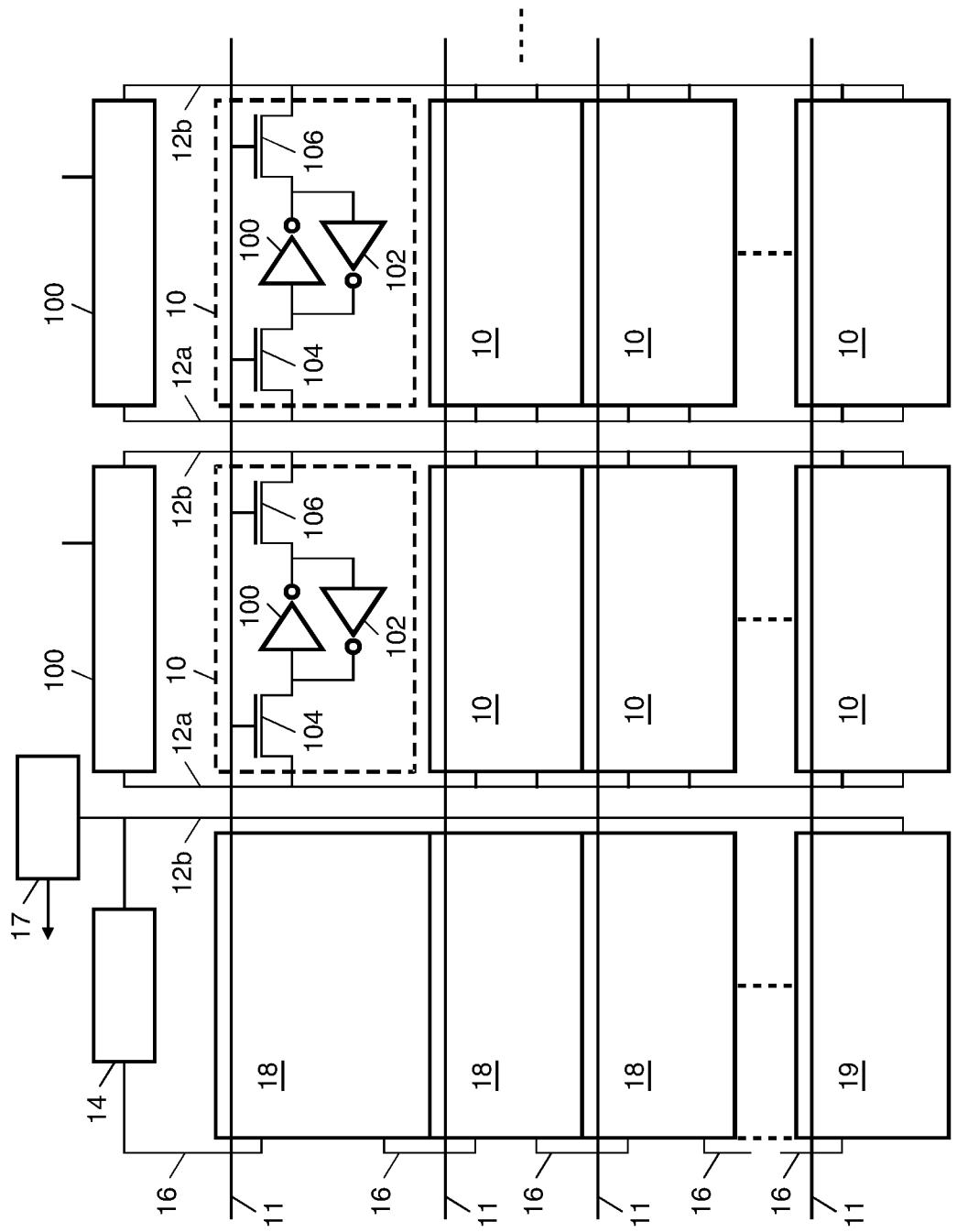
FIG. 1 shows a memory matrix according to an embodiment of the invention.

FIG. 1 schematically shows a matrix, with rows and columns of cells 10, 18, 19. Respective word lines 11 (row conductors) are provided for the rows. Pairs of bit-lines 12a,b (bit-conductors) are provided for a number of the columns. In each of a number of columns a sense amplifier 100 is coupled to the bit-lines 12a,b of the column.

For one column, a control circuit 14 and a measurement circuit 17 are provided and a first bit-line is replaced by bit-line fragments 16 and a second bit-line 12b is provided as for the other columns. Control circuit 14 is coupled between a bit line fragment 16 that is coupled to an uppermost cell 18 of this column and the second bit line 12b of this column. Control circuit 14 comprises a switch or an enabled logic gate (not shown) for selectably coupling the second bit line 12b to the bit line fragment 16 that is coupled to an uppermost cell 18 of this column. Measurement circuit 17 has an input coupled to the second bit-line 12b of this column. Although the column with bit line fragments 16 has been drawn at the edge of the matrix by way of example, it should be appreciated that it may be located anywhere in the matrix. In an embodiment, the relative location of control circuit 14 relative to the column with fragmented bit lines 16 is the same as the relative location of the sense amplifiers 100 relative to the other column. Thus control circuit may fit in with the layout of the memory matrix with its sense amplifiers.

An integrated circuit with a memory matrix may additionally contain conventional row selection circuits coupled to word lines 11, column selection circuits coupled to bit-lines 12a,b, write circuits coupled to bit-lines 12a,b etc. These have been omitted from the Figure for the sake of clarity. Furthermore, the integrated circuit may contain logic circuits etc., also not shown.

It should be realized that the Figure is merely schematic: in a practical integrated circuit the components are realized in a three dimensional structure of mutually isolated conductor tracks, transistors with channel regions and gates and power supply connections. Thus, for example, bit lines 12a,b will usually run over an area where other components of the cell are realized and not adjacent to the cell as shown in the schematic Figure. Similarly, inverters are not black boxes with internal spaces that are out of bounds for any conductors that do not belong to the black box: for example, in a practical integrated circuit a conductor that is functionally outside the inverter may well run in between different component parts of the inverter.

In an embodiment, all cells have the same layout of those components that are present in the cell. That is, for all normal memory cells 10 the layout is mutually the same and in the layout of cells 18 in the column with bit-line fragments that contain a first inverter 100 and a second inverter 102 the relative positions of the components that make-up the inverters are the same as in normal memory cells 10.

In the layout of the matrix in the integrated circuit, the bit lines 12a,b of each column lie at the same position relative to the inverters of the cells in that column. In the column with bit line fragments 16, the bit line fragments 16 lie at the relative position for one of the bit lines relative to the inverters of the cells in that column. If extended to connect to each other, the bit line fragments would form a bit line like any other bit-line at the same position relative to the cells as bit-lines in other columns.

A plurality of the columns of the matrix comprise static memory cells 10 (one shown in more detail), each with a first inverter 100, a second inverter 102, a first access transistor 104 and a second access transistor 106. The majority of the columns in the matrix, for example all but one, are of this type. In these static memory cells 10 the inputs and outputs of first inverter 100 and second inverter 102 are cross-coupled and the channels of the first and second access transistor 104, 106 are coupled between respective bit-lines 12a,b and the inputs of the first and second inverter 100, 102 respectively. The gates of first and second access transistor 104, 106 are coupled to the word line 11 of the row in which the cell is located.

Figure 2:
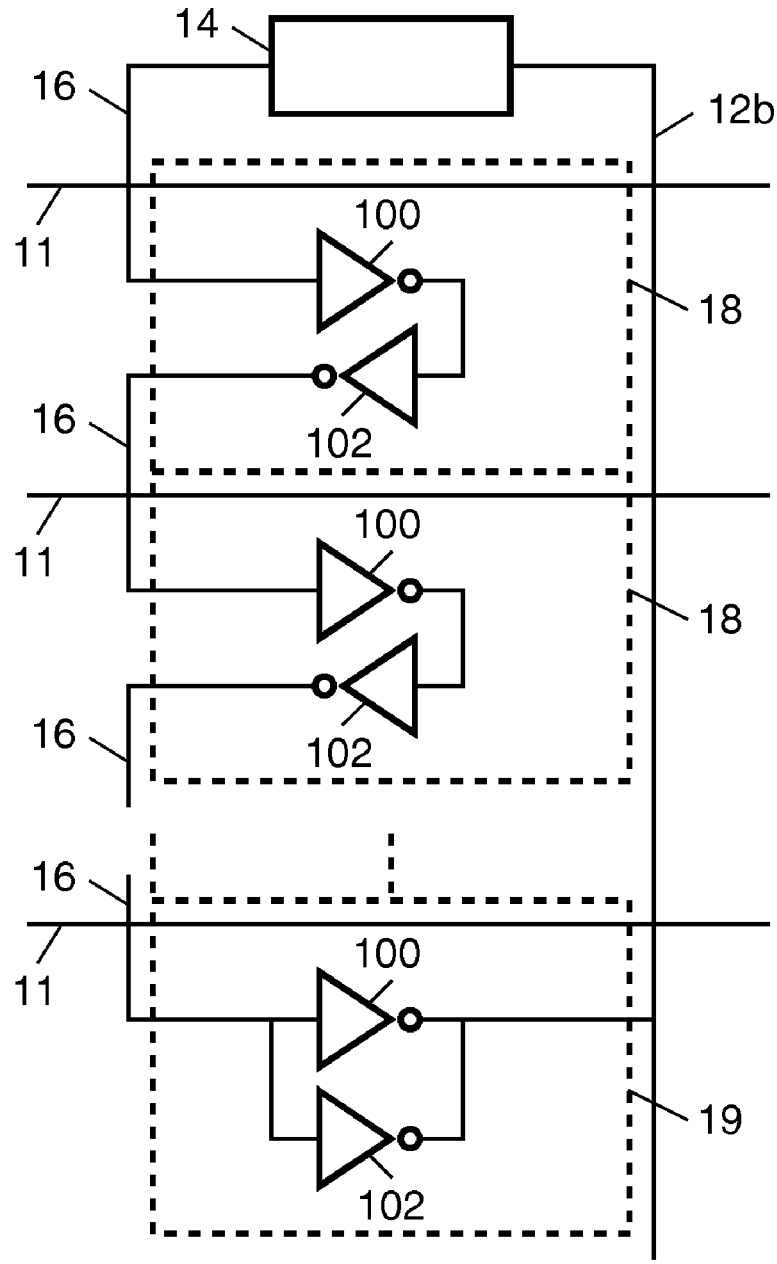
FIG. 2 shows part of a column of the memory matrix.

FIG. 2 shows the column with bit-line fragments 16 in more detail. The cells in this column have fewer components compared to the static memory cells 10 in the other columns. Cells 18 of a first type are used in a number of rows of this column. Cells 18 of this type have a first inverter 100 with an input coupled to a bit-line fragment 16 from a cell in a preceding row, without intervening access transistor channel (or to control circuit 14 in the case of the uppermost row), and an output coupled to an input of the second inverter 102 in the cell. The second inverter 102 in the cell has an output coupled to a bit-line fragment 16 to a next row without intervening access transistor channel. A cell 19 of a second type in a final row has its first and second inverter 100, 102 coupled in parallel between a bit-line fragment 16 from a cell in a preceding row, and a second bit-line 12b. Second bit-line 12b is coupled to the input of control circuit 14.

In operation the column with bit-line fragments 16 may be used as a ring-oscillator, when control circuit 11 couples the second bit-line 12b and the bit-line fragment of the column. In this case, the first and second inverters 100, 102 of the cells of the first and second type, together with their connections via bit-line fragments 16 and second bit line 12b form a circuit loop with an odd number of inverters 100, 102. Measurement circuit 17 may be configured to measure an oscillation frequency of the ring-oscillator, for example by using a counter (not shown) to count pulses of the oscillation signal.

As may be noted, parallel inverters 100, 102 are used to drive the second bit-line 12b. This has the advantage that the relative contribution of the delay due to the capacitance inherent in the length of the second bit line will be reduced. Alternatively, a stronger drive circuit in controller 14 could be used to drive the second bit-line, all inverters being coupled the other way around. Use of parallel inverters has the advantage that control circuit 14 may be kept small.

Figure 3B:
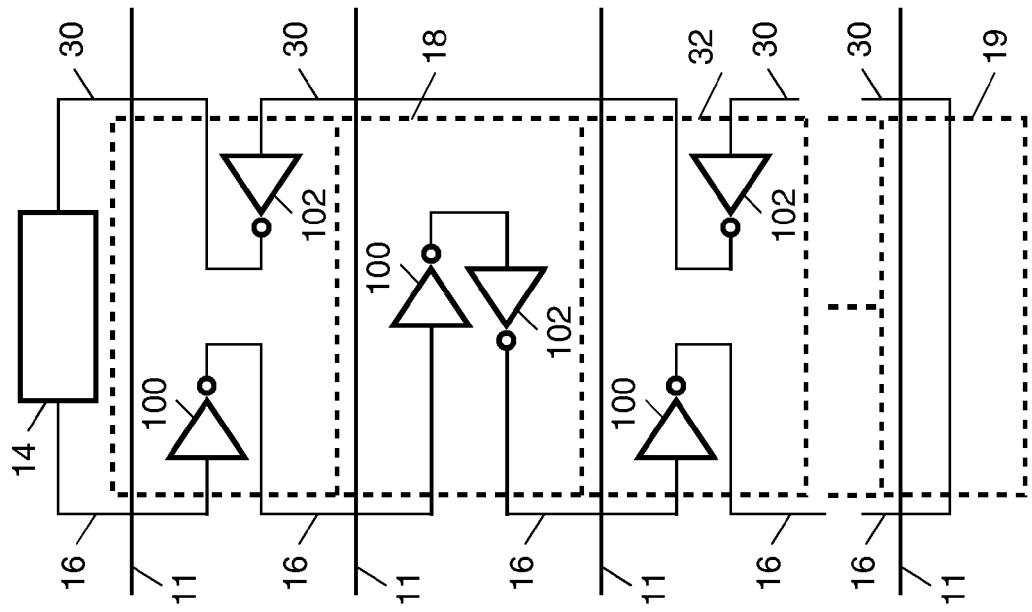
FIGS. 3a,b show part of a column of the memory matrix.
Figure 3A:
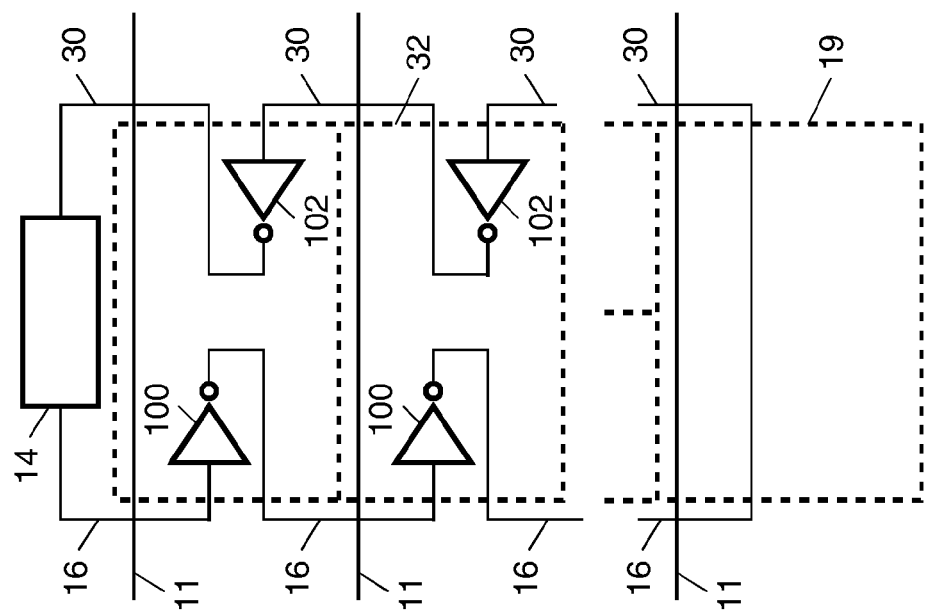

FIGS. 3a,b show alternative embodiments of cells in the column with the ring-oscillator. FIG. 3a shows an embodiment wherein both bit-lines have been split into fragments 16, 30. In this embodiment, the cells 18 of the first type (not shown) have been replaced by cells 32 of a type wherein the first inverters 100 connect bit line fragments 16 at the location of a first bit line and second inverters 102 connect bit line fragments at the location of a second bit line, in a direction opposite to the direction of connection of the first inverters 100. As can be seen the first and second inverters 100, 102 again form a circuit loop with an odd number of inverters along the loop, to act as a ring-oscillator.

Any mix of the embodiments of FIGS. 2 and 3a may be used. FIG. 3b shows an example of such an embodiment. As may be noted in this embodiment the length of the bit line fragments 16, 30 never extends over the entire length of the column, so that little drive power is needed to drive the fragments. Although an embodiment has been shown wherein all inverters in the circuit loop are realized by inverters in cells of the matrix, it should be understood that one or more additional converters in the circuit loop may be provided in control circuit 11. In this case an odd number of inverters may be realized in the circuit loop even if the column may provide an even number of inverters in the circuit loop. Thus cells of the second type may be used at more than one places or the cell 19 of the second type may be replaced by a cell of the first type.

Figure 4A:
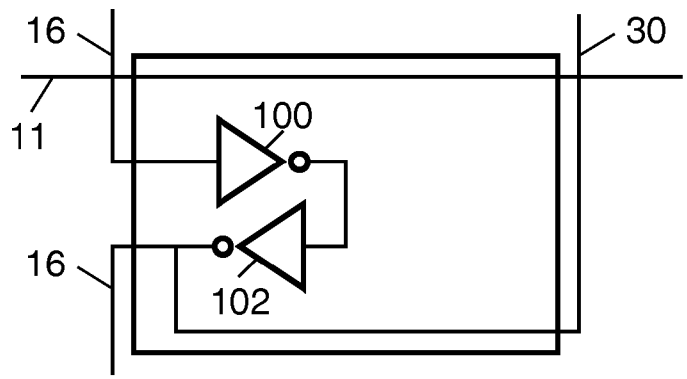
FIG. 4 shows alternative cells of the memory matrix.
Figure 4B:
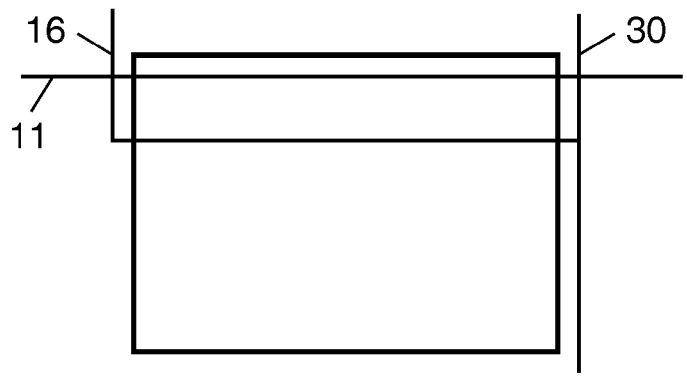
Figure 4C:
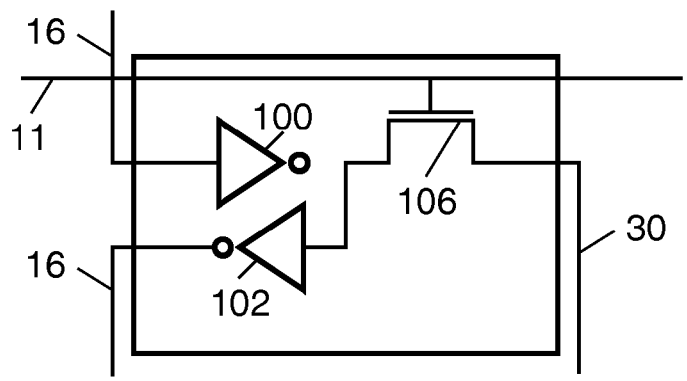

FIGS. 4a,b show alternatives for final cell 19 that may be used in any of the embodiment. FIG. 4c shows an alternative cell that may be used to activate the ring-oscillator using a signal on a selected word line 11. However, using a control circuit 11 with a switch outside the matrix to activate the ring-oscillator has the advantage that the ring-oscillator will not be activated during normal operation of the memory matrix.

As may be noted from the Figures, because bit line fragments 16, 30 are used between cells 14, 18, 19, 32, in combination with connections to the bit line fragments from the cells, the number of components and connections in all cells need not be greater than the number of components and connection in normal memory cells 10.

It is preferred that all cells of the column with bit line fragments 16 are included in one series arrangement of inverters. However, in an alternative embodiment part of the cells may be outside the series arrangement.

As will be appreciated, in each embodiment the ring-oscillator contains a circuit loop with an odd number of inverters along the circuit loop. In the embodiments described so far, this was realized by using a single inverter in the final cell 19 in the column with the ring-oscillator and an even number of inverters in all other cells of that column. However, in other embodiments an odd number of inverters may be realized in many other ways. Any cell may be configured to provide only a single inverter in the circuit loop, and even an odd plurality of cells may be used that provide only a single inverter in the circuit loop.

In the illustrated embodiments signal propagation through a series arrangement of inverters 100, 102 in cells of column with bit line fragments 16 is enabled by means of an access transistor 106 in a single row of that column, wherein the series arrangement of inverters runs through the channel of the access transistor under control of its gate. In the other rows, no access transistors are used with their channel in the series arrangement of inverters. Thus, propagation, and resulting ring-oscillator oscillation can be enabled by selecting a single row. However, it should be noted that the relevant access transistor may be located in any row of the column. In an embodiment two access transistors in a cell in a single row may be used, with the series arrangement of inverters running through their channels.

In cells wherein the channels of the access transistors, if present, are not connected in series with the series arrangement of inverters, access transistors, when present may still be connected between the inverters and a bit line fragment 16 or bit line 12*b*.

In the preceding embodiments, the circuit loop of the ring-oscillator is contained entirely within a column with bit line fragments 16, in the cells of that column, the control circuit in that column and the bit-line fragment and/or bit lines of that column. An advantage of using a circuit loop inside the column is that the matrix can be tested free from outside influences. In an embodiment the inverters of the circuit loop lie at the same relative positions in the column as the inverters of the cells of the normal columns. By using bit line fragments at the position for bit-lines and no more inverters than the inverters that are also present in normal columns, the column containing the circuit loop may have the size of a normal column of the matrix. By using inverters at the same positions as in other cells, the oscillation is made maximally representative of the matrix as a whole. However, deviations may be acceptable, even if they reduce the representativity of the results.

Figure 5:
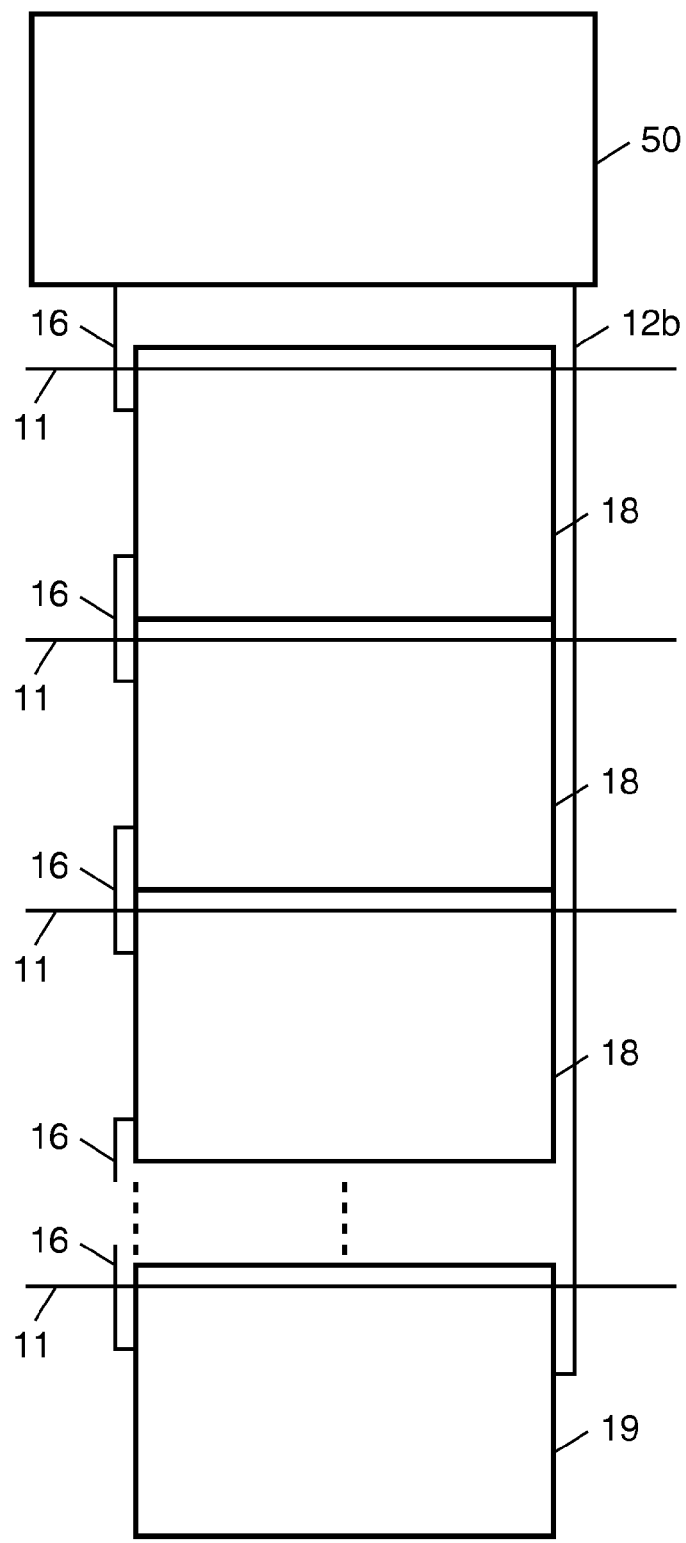
FIG. 5 shows part of a column of the memory matrix.

FIG. 5 shows an alternative embodiment, wherein there is no circuit loop inside the column with bit line fragments 16, but the inverters are part of a circuit that includes a measurement circuit 50 outside that column. In an embodiment measurement circuit 50 may comprise a circuit that connects to the inverters in column with bit line fragments 16 to form a circuit loop of a ring-oscillator and a counter to count a frequency of this ring-oscillator. However, in an alternative embodiment no ring oscillator is formed. Instead measurement circuit may comprise an edge generator circuit coupled an input of the series arrangement of inverters in the column with bit line fragments 16 and a detector coupled to the output of the series arrangement. The detector may be configured to count clock pulses between edges generated by the edge generator circuit and arrival of resulting edges at the detector. The measurement circuit 50 measures a delay through the inverters, be it through switching them as a ring-oscillator, or by other means.

In another embodiment part of the cells of the column with fragmented bit lines may be normal static memory cells. In this case this column may have a normal sense amplifier, coupled to a continuous bit-line part that connects these cells at one side of the matrix, the control circuit 14 or measurement circuit being coupled to cells at the opposite side of the matrix. In another embodiment a first part of the cells in a column with bit line fragments is coupled in a first series arrangement and a second part of the cells of that column is coupled in a second series arrangement. In another embodiment first inverters of cells of such a column may be coupled in a first series arrangement and second inverters may be coupled in a second series arrangement. In this type of embodiment a test circuit may be coupled to the respective series arrangement at mutually opposite ends of the column respectively.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. An integrated circuit comprising a matrix of rows and columns of cells, each cell comprising a first inverter and a second inverter, the matrix including:
   a plurality of columns, each column of the plurality having a bit-line, the first inverter and the second inverter in each cell of the column being cross-coupled to each other and coupled to bit-line of the column;
   a further column, comprising mutually disconnected bit-line fragments extending along the cells in the further column, at relative positions with respect to the cells in the further column corresponding to relative positions of parts of the bit-line of the plurality of columns with respect to the cells in the plurality of columns, at least the first inverters of cells in respective pairs of rows of the further column being coupled in series via said bit line fragments.

2. An integrated circuit according to claim 1, comprising a circuit loop for forming a ring-oscillator, the first inverters of said respective pairs of rows of the further column being coupled in series in the circuit loop via the bit line fragments.

3. An integrated circuit according to claim 1, wherein the further column comprises a further bit-line extending in parallel with the bit line fragments along the entire further column, the further bit line being connected in series with the bit line fragments and the first inverters in the respective pairs of rows that are coupled in series via said bit line fragments.

4. An integrated circuit according to claim 1, wherein a cell in the further column has its first inverter and second inverter coupled in parallel, with outputs coupled to the further bit-line both to drive the further bit-line.

5. An integrated circuit according to claim 1, wherein each column in the plurality of columns has a further bit-line in parallel with the bit-line of the column, the further column comprising mutually disconnected further bit-line fragments extending in parallel with the bit line fragments, at a relative position with respect to the cells in the further column corresponding to relative positions of the further bit-lines of the plurality of columns with respect to the cells in the plurality of columns, the further bit-line fragments being coupled in series with the bit line fragments and the first inverters in said respective pairs of rows of the further column.

6. An integrated circuit according to claim 1, wherein the first inverters and the second inverters of at least part of the cells in the further column are coupled in series in a series arrangement that comprises the bit line fragments coupled in series with the first inverters and the second inverters of said at least part of the cells.

7. An integrated circuit according to claim 1, comprising a control circuit outside the matrix, coupled to at least one of the bit line fragments and configured to establish a ring oscillator with a circuit loop that comprises the first inverters of cells in said respective pairs of rows of the further column.

8. An integrated circuit according to claim 7, comprising sense amplifiers in respective ones of the columns of said plurality of columns, and wherein the control circuit has a relative position with respect to the cells of the further column corresponding to a relative position of the sense amplifiers with respect to the cells of the columns in the plurality of columns.

9. An integrated circuit according to claim 1, wherein the further column comprises cells wherein the first and second inverters are not cross-coupled, but coupled in series or in parallel or partly disconnected.

10. A method of monitoring performance of an integrated circuit that comprises a matrix of rows and columns of cells, each cell comprising a first inverter and a second inverter, the columns comprising first columns with a bit-line, the first inverter and the second inverter in each cell of the first columns being cross-coupled to each other and coupled to bit-line of that first column, the method comprising:
 coupling at least the first inverters of cells respective pairs of rows of a further column of the matrix in series, via bit line fragments that are mutually disconnected and extend along the further column, at relative positions with respect to the cells in the further column corresponding to relative positions of parts of the bit-line of the first of columns with respect to the cells in the first columns;
 measuring a delay during signal propagation through the bit line fragments and at least the first inverters of cells in the respective pairs of rows of the further column.

\* \* \* \* \*